United States Patent [19]

Deitch et al.

[11] 4,002,399

[45] Jan. 11, 1977

[54] PRINTED CIRCUIT JACK

[75] Inventors: James C. Deitch, Bloomington; Lawrence F. Leistiko, Minneapolis, both of Minn.

[73] Assignee: Magnetic Controls Company, Minneapolis, Minn.

[22] Filed: Oct. 6, 1975

[21] Appl. No.: 619,594

[52] U.S. Cl. ........................ 339/221 M; 339/17 C; 339/182 R

[51] Int. Cl.$^2$ .................... H01R 13/50; H05K 1/04

[58] Field of Search ........... 339/17 R, 17 C, 149 P, 339/150 B, 182 R, 182 RS, 183, 217 R, 217 S, 221 R, 221 L, 221 M; 179/1 PC

[56] References Cited

UNITED STATES PATENTS

| | | | |
|---|---|---|---|
| 2,861,253 | 11/1958 | Johanson | 339/217 S |
| 3,289,149 | 11/1966 | Pawloski | 339/183 |
| 3,403,369 | 9/1968 | Steiff et al. | 339/221 R X |
| 3,514,737 | 5/1970 | Renshaw | 339/17 C |
| 3,697,933 | 10/1972 | Black et al. | 339/17 C X |
| 3,915,535 | 10/1975 | O'Keefe et al. | 339/217 R X |

*Primary Examiner*—Roy Lake
*Assistant Examiner*—Mark S. Bicks
*Attorney, Agent, or Firm*—Neil B. Schulte

[57] ABSTRACT

A molded electrical jack housing adapted for mounting directly on a printed circuit board in which the electrical contacts are all inserted from one side of the housing and have connection lugs extending through the opposite side of the housing and in which the electrical contacts are formed from spring metal material and shaped to have tabs which rest on special plateau areas formed in the housing.

5 Claims, 10 Drawing Figures

FIG. 8
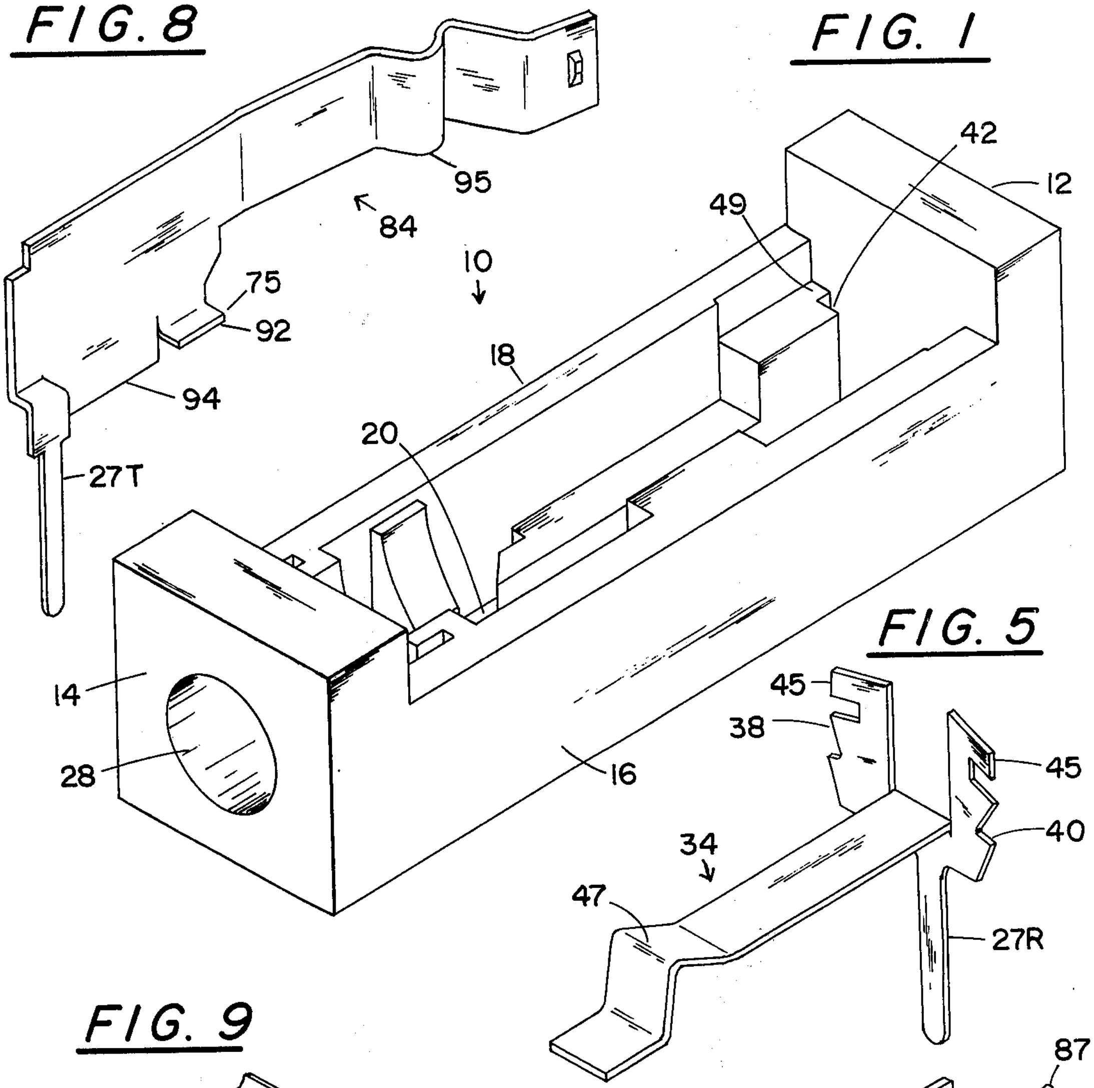
FIG. 9
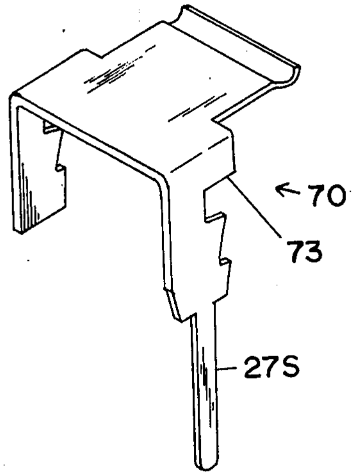
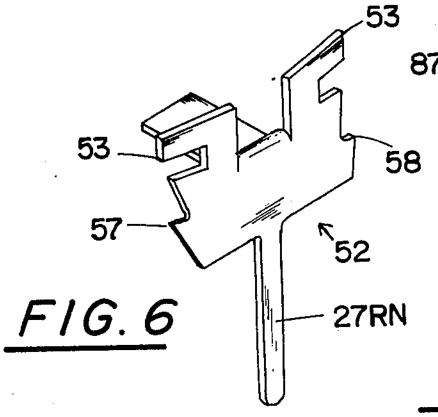
FIG. 6
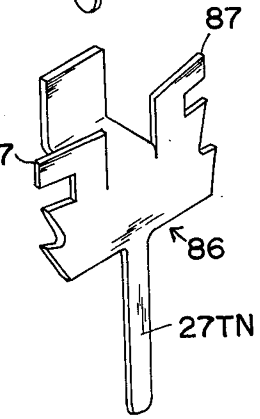
FIG. 7

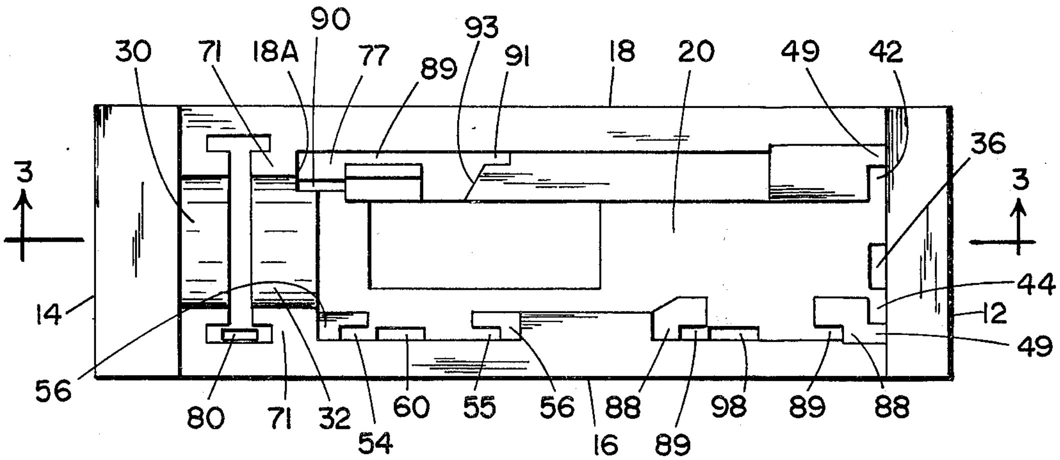
FIG. 2
FIG. 3
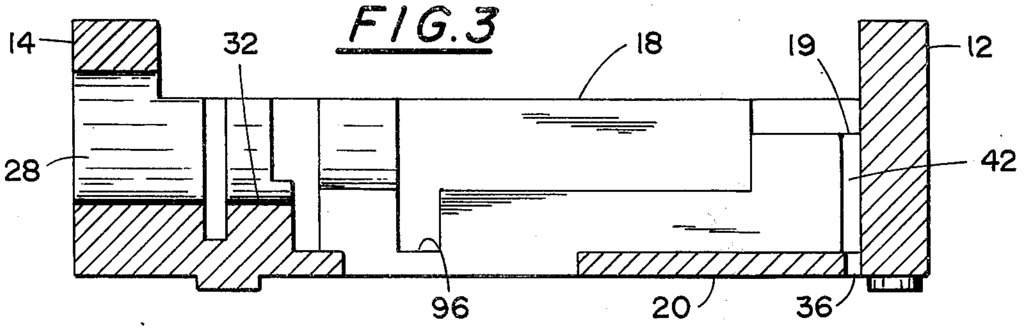
FIG. 4
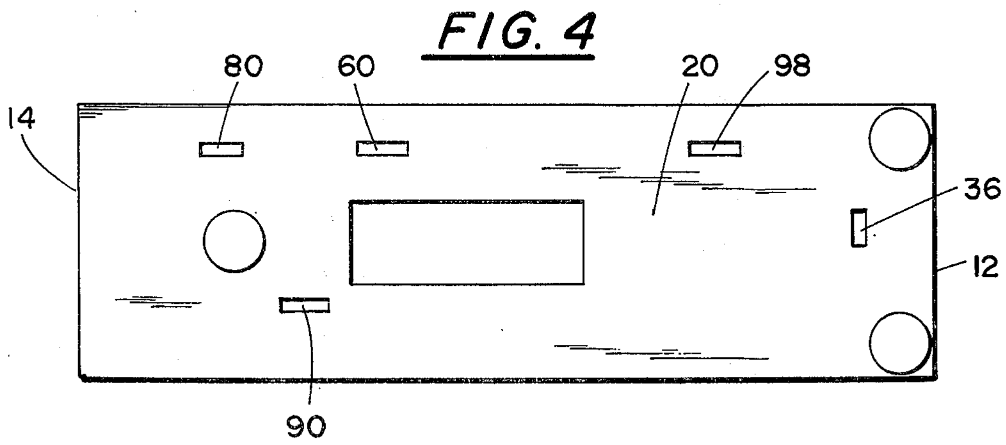

PRINTED CIRCUIT JACK

BACKGROUND OF THE INVENTION

This application relates to an improvement to the printed circuit jack shown in our co-pending application Ser. No. 549,731 filed Feb. 13, 1975, now abandoned in favor of continuation application No. 698,891 filed June 1, 1976 in the name of the present inventors. In this co-pending application a jack is disclosed which is molded from plastic in such a way as to be open on one side, so as to accept small spring metal contacts therein, and substantially closed on the opposite side so as to retain the contacts. Lugs extend from the spring contacts through holes in the opposite side to make electrical contact with a circuit board. The spring contacts are held in place in the housing by slots formed on the side walls of the housing which slots receive barbs formed on the springs in a locking relationship which holds the springs in position to receive a plug therein. Although these bars operate to hold the springs securely in the slots, it has been found that upon assembly the spring metal contacts are not necessarily always in the exact same positions relative to the housing. This results in an inconsistent shape for the plug receiving chamber which could result in less than ideal electrical connections. The present invention avoids this difficulty as described hereinafter.

SUMMARY OF THE INVENTION

Briefly, our invention changes the shape of the housing to provide a number of plateau areas proximate to the slots which hold the spring metal contacts. The spring contacts are then provided with small tabs or projections which are caused, during assembly, to come to rest directly on these plateaus. This then insures that all of the contacts are correctly inserted to the proper position and depth resulting in reliable positioning of the contacts and consistently proper electrical connections. In addition, with respect to one of the contacts, namely the tip spring contact, the mounting slot has been lengthened to permit the use of a stiffer spring which can be contained totally within the housing rather than flexing through a hole in one of the side walls as was the case in the above mentioned co-pending patent application. This results in a more securely mounted tip spring and improved reliability in the electrical connection therefrom. It may therefore be seen that it is an object of our invention to provide an improved jack which can be mounted directly to a circuit board and which incorporates spring metal contacts mounted solidly and consistently in accurately determined positions. Further object and advantages will become apparent from the following detailed description and drawings.

BRIEF DESCRIPTION OF THE DRAWINGS

FIG. 1 is a perspective view of the housing of our jack.

FIG. 2 is a top view of the jack of FIG. 1.

FIG. 3 is a sectional view taken on line 3—3 in FIG. 2.

FIG. 4 is a bottom view of the jack housing.

FIGS. 5, 6, 7, 8, and 9 are perspective views of the various spring contact members which fit into the housing shown in FIGS. 1 through 4.

DESCRIPTION OF THE PREFERRED EMBODIMENT

Figure 10:
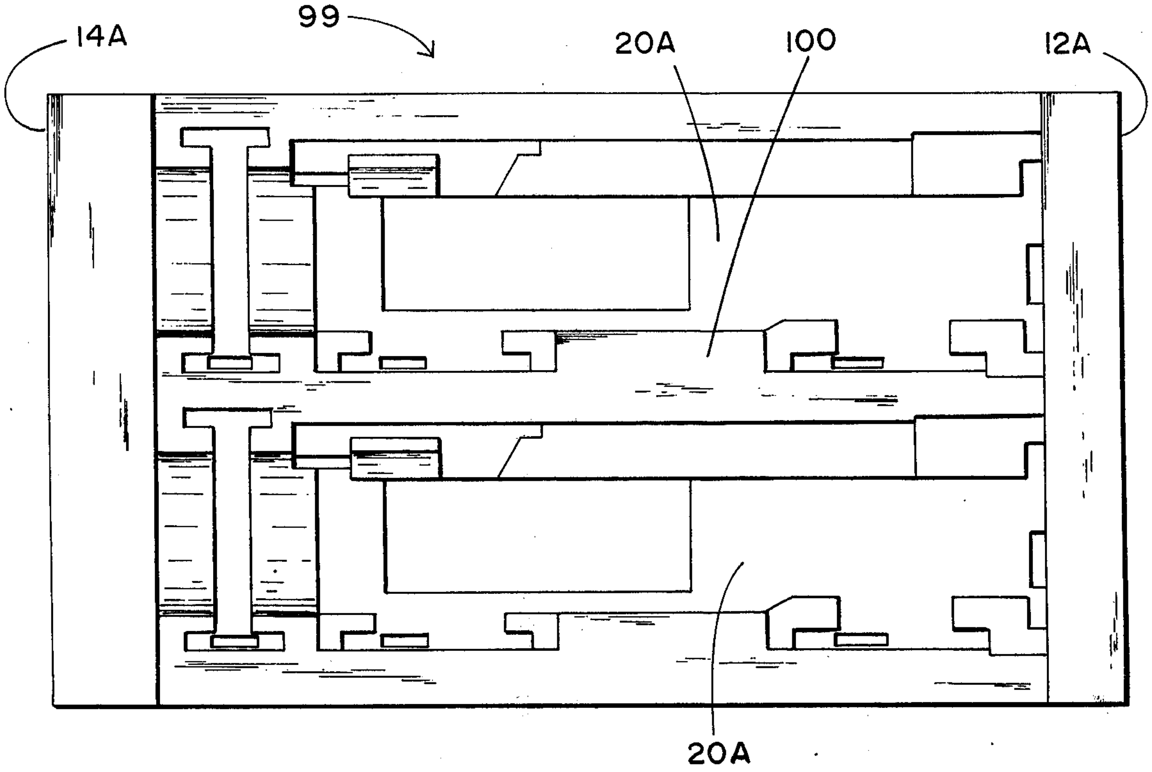
FIG. 10 is a top view of a variation of the housing design in which two jacks are provided side by side utilizing a common wall therebetween.

For ease of description some of the detailed structure of the present invention has been omitted since it is described completely in the above mentioned co-pending prior application. This prior application is hereby incorporated by reference and, when needed, references should be made thereto for details of construction especially with respect to the spring metal contacts.

Referring simultaneously to FIGS. 1, 2, 3, and 4 the jack housing 10 of the present invention is shown. Two smaller end surfaces 12 and 14 are connected together by longer side walls 16 and 18 and a bottom wall 20. A hole 28 is provided in end surface 14 so that a plug may be inserted into jack 10 and into the interior trough-like space between walls 16, 18, and 20. The plug may comprise a standard telephone type plug well known to those skilled in the art. When inserted, it rests in a pair of troughs 30 and 32 as shown in FIGS. 2 and 3.

Continuing the use of telephone jack and plug terminology as employed in the prior co-pending application, a ring spring 34 is shown in FIG. 5. Ring spring 34 is positioned in the housing, as shown in FIG. 1, generally in the orientation shown in FIG. 5. The elongated portion of spring 34 lies along bottom wall 20 on the inside surface with the circuit board contacting lug 27R extending down through a hole 36. As in the prior application a number of barbs 38 and 40 slide into a locking engagement respectively with a pair of slots 42 and 44. The barbs are suitably bent and sized to hold the ring spring firmly in place. However, in the present invention the spring is modified to include a pair of additional tabs or protrusions 45 which come to rest on top of a pair of plateau areas 49. Since plateaus 49 are near the top of the housing the position of ring spring relative to these plateaus may be easily determined during assembly. The spring is pushed down into slots 42 and 44 until the underside of tabs 45 comes to rest firmly on plateaus 49. The assembler can then be confident that the spring is properly positioned at the correct vertical height so that the spring action of ring spring 34 is consistent and reliable.

The insertion of the plug brings it into contact with a hump 47 on ring springs 34 creating an electrical circuit and also moving spring 34 downward to break contact with the ring normal spring 52 shown in FIG. 6.

The ring spring mounts in a pair of slots 54 and 55 and is locked therein by means of bent and angled barbs 57 and 58. Once again an additional pair of tabs or protrusions 53 are provided with generally horizontal under surfaces which come to rest on a pair of plateaus 56 formed in housing 10 on each side of slots 54 and 55. A lug 27RN extends through a hole 60 in the bottom wall 20 to make contact with the circuit board. As with the ring spring, the ring normal spring can be inserted until tabs 53 rest securely on plateaus 56. Since the plateaus are easily visible from the top of the housing this positioning is readily accomplished by the assembler.

Ground contact is made by a sleeve spring 70 shown in FIG. 9. Spring 70 mounts in slots in both of the side walls and rests on plateau areas 71 by means of tabs 73. A lug 27S extends through a hole 80 to make contact with the circuit board.

In FIG. 8 an improved tip spring 84 is shown which mounts in a slot 89 with a lug 27T extending through a hole 90. In our prior application, referenced above, tip spring 84 is held primarily by means of barbs in slot 89. These barbs tended to push out the side wall 18 and thus to hold less tightly. In the present improved embodiment, however, spring 84 is additionally locked in place by a slot 91 allowing the barbs to be eliminated. A corner 75 on a tab 92 bent out from the bottom of spring 84 is force fitted against an angled surface 93 upon insertion, thus causing spring 84 to be forced firmly against side wall 18A. Walls 18A and 93 resit bending better than the sides of slot 89. A protrusion or tab 94 extends downward to rest on a plateau area 77 at the bottom of slot 89 to determine the vertical position of the spring. Since spring 84 is mounted quite solidly in the housing it is possible to make the portion of the spring that flexes shorter and therfore stiffer. This in turn means that the spring can operate within the confines of the housing rather than flexing out through a hole in the side wall 18 as was the case in our prior application. Accordingly, in the present invention side wall 18 is not provided with a relief hole but rather runs the entire length of the housing producing a housing which is stronger. Insertion of a plug through hole 28 produces an electrical connection with the hump 95 on spring 84 and moves tip spring 84 sideways out of contact with the tip normal spring 86 shown in FIG. 7. Tip normal spring 86 is also provided with additional tabs or projections 87 which rest upon small plateau areas 88 when spring 86 is inserted into slots 89. Lug 27TN extends downward through a hole 98 so as to make contact with the circuit board.

In FIG. 10 a variation of the present invention is shown wherein a pair of jacks 99 are formed side by side having identically molded configuratons with the exception that a common wall in the center incorporation the slots for both jacks. In FIG. 10 this common wall is identified by the number 100. The dual jack would of course include continuous end walls 12A and 14A and a common bottom wall 20A. Dual jack 99 is made stronger by the elimination of the relief window in wall 18 which, in turn, is made possible by the use of a better mounted and stiffer tip spring 84.

I claim:

1. A molded dual jack especially suitable for direct connection on its bottom side to a printed circuit board comprising an elongated molded non-conducting housing having an elongate axis and first and second generally parallel end surfaces generally perpendicular to the elongate axis at opposite ends of the housing, said end surfaces connected together by elongated first, second and third side walls extending therebetween, parallel to the elongate axis, said end surfaces also connected together by an elongated intermediate side wall which is positioned between said first and second side walls, and perpendicular to said third side wall and said housing having two entrance holes in said first end surface to accept plugs along side the elongate axis therethrough into the spaces between the side walls and on each side of the intermediate wall, with a plurality of spring metal contacrs mounted in said housing by means of a plurality of vertical slots, said slots formed in the first, intermediate, and second side walls generally orthogonal to the elongate axis of said housing, said slots open on the side opposite said third side so as to accept the spring contacts from the open side of the housing, said contacts having lugs extending therefrom which extend through the bottom of the housing to make contact with the circuit board, and said spring contacts in each space including at least one pair of balanced spring contacts comprising a first spring contact over the open side of the housing proximate the first end surface mounted in a vertical slot in the first side wall and a vertical slot in the intermediate wall so as to press against the side of a plug inserted into the housing, and a second spring contact extending along the third side wall parallel to the elongate axis and mounted proximate the second end surface in vertical slots in the intermediate, and side walls so as to press against the other side of the plug inserted into the housing to balance the force of said first spring contact.

2. The jack of claim 1 in which said third side is on the bottom and said vertical slots are substantially closed at their bottom ends, except for holes which pass said lugs, so as to segregate said spring contacts from the circuit board.

3. The jack of claim 2 in which said spring contacts include two third spring contacts, one mounted along said first side wall and in vertical slots in said first side wall so as to press against the side of a plug inserted into the housing, said housing having a riser molded on the opposite intermediate side of the plug from said third spring so as to resist the force from said third spring and the other mounted along said intermediate wall in vertical slots in the intermediate wall with a riser on the opposite second side wall to resist the force of the third spring.

4. The jack of claim 3 in which said second and third spring contacts extend beyond their points of contact with an inserted plug to contact normal through spring contacts when no plug is inserted in the housing, said normal through contacts mounted in vertical slots in said intermediate and second side walls.

5. The jack of claim 4 in which the spring contacts are formed with barbs on the portions that fit into the slots so as to lock said spring contacts therein, said barbs being shaped and angled steeply to grasp the slots but still enter the slots easily.

* * * * *